(12) United States Patent
Rinerson et al.

(10) Patent No.: US 7,985,963 B2
(45) Date of Patent: *Jul. 26, 2011

(54) MEMORY USING VARIABLE TUNNEL BARRIER WIDTHS

(75) Inventors: Darrell Rinerson, Cupertino, CA (US); Christophe Chevallier, Palo Alto, CA (US); Wayne Kinney, Emmett, ID (US); Edmond Ward, Monte Sereno, CA (US)

(73) Assignee: Unity Semiconductor Corporation

( * ) Notice: Subject to any disclaimer, the term of this patent is extended or adjusted under 35 U.S.C. 154(b) by 166 days.

This patent is subject to a terminal disclaimer.

(21) Appl. No.: 12/454,698

(22) Filed: May 21, 2009

(65) Prior Publication Data
US 2009/0231906 A1  Sep. 17, 2009

Related U.S. Application Data

(63) Continuation of application No. 10/934,951, filed on Sep. 3, 2004, now Pat. No. 7,538,338.

(51) Int. Cl.
*H01L 47/00* (2006.01)

(52) U.S. Cl. . 257/4; 257/2; 257/E45.003; 257/E29.002; 257/43

(58) Field of Classification Search .................. 257/4
See application file for complete search history.

(56) References Cited

U.S. PATENT DOCUMENTS

| 6,034,882 | A | 3/2000 | Johnson et al. |
| 7,460,385 | B2 | 12/2008 | Gruber et al. |
| 7,538,338 | B2 | 5/2009 | Rinerson et al. |
| 2003/0151959 | A1 | 8/2003 | Tringali et al. |

*Primary Examiner* — Jerome Jackson, Jr.

(57) ABSTRACT

A memory using a tunnel barrier that has a variable effective width is disclosed. A memory element includes a tunneling barrier and a conductive material. The conductive material typically has mobile ions that either move towards or away from the tunneling barrier in response to a voltage across the memory element. A low conductivity region is either formed or destroyed. It can be formed by either the depletion or excess ions around the tunneling barrier, or by the mobile ions combining with complementary ions. It may be destroyed by either reversing the forming process or by reducing the tunneling barrier and injecting ions into the conductive material. The low conductivity region increases the effective width of the tunnel barrier, making electrons tunnel a greater distance, which reduces the memory element's conductivity. By varying conductivity multiple states can be created in the memory cell.

33 Claims, 9 Drawing Sheets

FIG. 5A  FIG. 5B

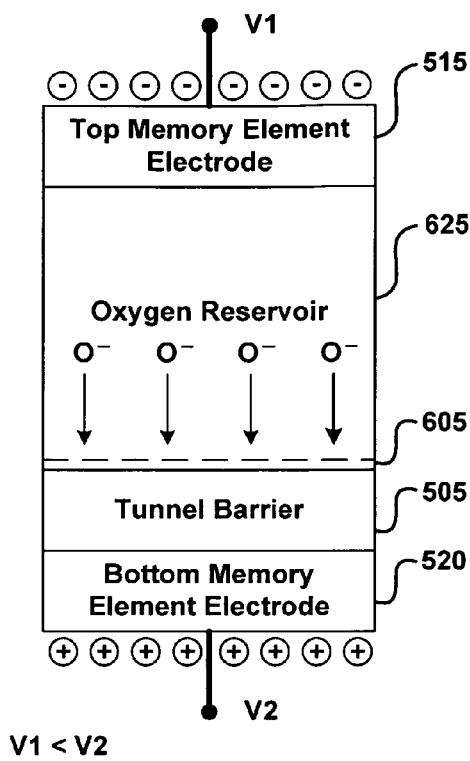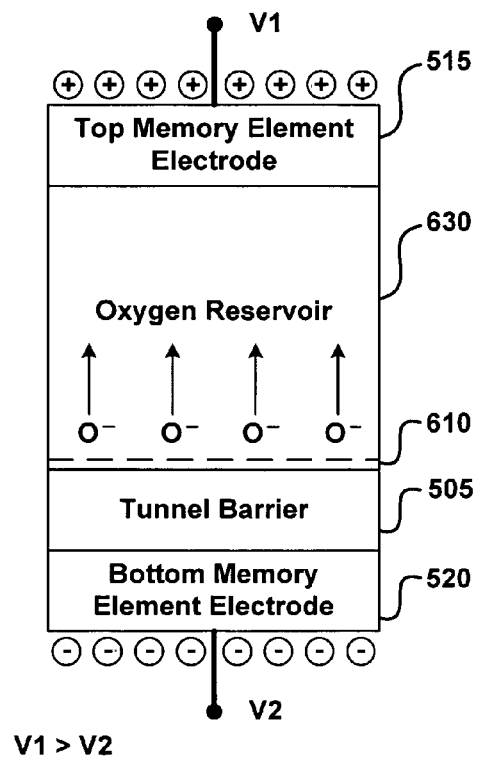
FIG. 6A  FIG. 6B

MEMORY USING VARIABLE TUNNEL BARRIER WIDTHS

BACKGROUND OF THE INVENTION

1. Field of the Invention

The present invention relates to non-volatile computer memory.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Since the 1960s, a large body of literature has evolved that describes switching and memory effects in metal-insulator-metal structures with thin insulators. One of the seminal works was "New Conduction and Reversible Memory Phenomena in Thin Insulating Films" by J. G. Simmons and R. R. Verderber in 301 Proc. Roy. Soc. 77-102 (1967), incorporated herein by reference for all purposes. Although the mechanisms described by Simmons and Verderber have since been cast into doubt, their contribution to the field is great.

However, nobody has successfully implemented a metal-insulator-metal structure into a commercial solid-state memory device. In the text "Oxides and Oxide Films," volume 6, edited by A. K. Vijh (Marcel Drekker 1981) 251-325, incorporated herein by reference for all purposes, chapter 4, written by David P. Oxley, is entirely devoted to "Memory Effects in Oxide Films." In that text, Oxley says "It is perhaps saddening to have to record that, even after 10 years of effort, the number of applications for these oxide switches is so limited." He goes on to describe a "need for caution before any application is envisaged. This caution can only be exercised when the physics of the switching action is understood; this, in turn, must await a full knowledge of the transport mechanisms operating in any switch for which a commercial use is envisaged."

In 2002, over twenty years after writing that chapter, Oxley revisited the subject in "The Electroformed metal-insulator-metal structure: A comprehensive model" by R. E. Thurstans and D. P. Oxley 35 J. Phys. D. Appl. Phys. 802-809, incorporated herein by reference for all purposes. In that article, the authors describe a model that identifies the conduction process as "trap-controlled and thermally activated tunneling between metal islands produced in the forming process." "Forming" (or "electroforming") is described as "the localized filamentary movement of metallic anode material through the dielectric, induced by the electric field. Here it is important to note that the evaporated dielectric may contain voids and departures from stoichiometry. When resulting filaments through the dielectric carry sufficient current, they rupture to leave a metal island structure embedded in the dielectric. Electronic conduction is possible through this structure by activating tunneling."

However, the authors caution, "The forming process is complex and inherently variable. Also tunneling barriers are susceptible to changes in their characteristics when exposed to water vapour, organic species and oxygen. Thus, device characteristics can never be expected to be produced consistently or be stable over long periods without passivation, effective encapsulation and a better understanding of the dynamics of the forming process."

In seemingly unrelated research, certain conductive metal oxides (CMOs), have been identified as exhibiting a memory effect after being exposed to an electronic pulse. U.S. Pat. No. 6,204,139, issued Mar. 20, 2001 to Liu et al., incorporated herein by reference for all purposes, describes some perovskite materials that exhibit memory characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

There are continuing efforts to incorporate solid state memory devices into a commercial non-volatile RAM.

BRIEF DESCRIPTION OF THE DRAWINGS

The invention may best be understood by reference to the following description taken in conjunction with the accompanying drawings, in which:

FIG. 5A depicts a block diagram representing the basic components of a memory element;

FIG. 5B depicts a block diagram of the memory element of FIG. 5A in a two-terminal memory cell;

FIG. 6A depicts a block diagram of the memory cell of FIG. 5B where oxygen accumulation near the tunnel barrier—oxygen reservoir interface results in a low conductivity region;

FIG. 6B depicts a block diagram of the memory cell of FIG. 5B where oxygen depletion near the tunnel barrier—oxygen reservoir interface results in a low conductivity region;

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional nonvolatile memory requires three terminal MOSFET-based devices. The layout of such devices is not ideal, usually requiring an area of at least 8 $f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of 4 $f^2$ can be utilized.

Figure 1A:
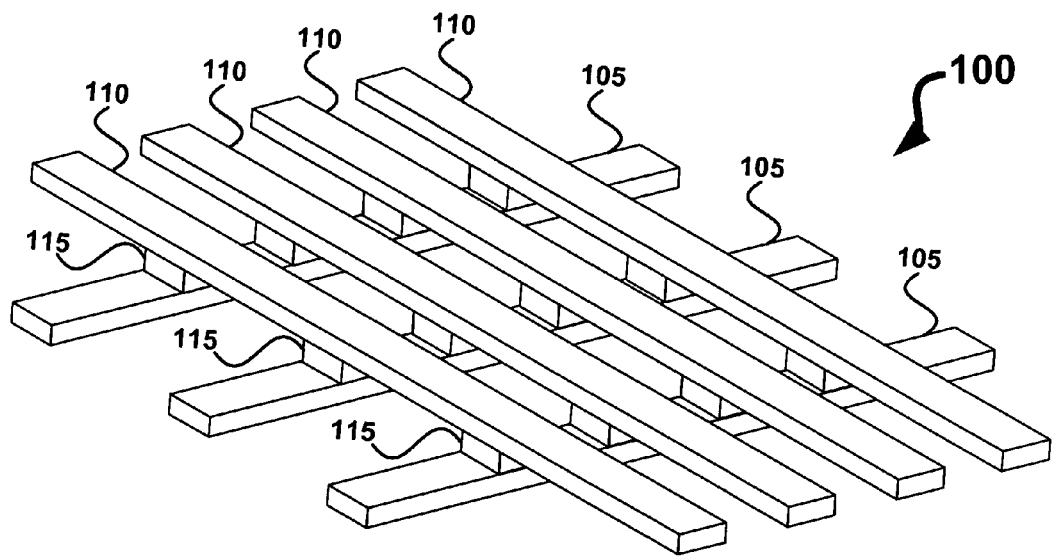
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array), which may be useful if they are made from different materials with different resistivities.

Figure 2A:
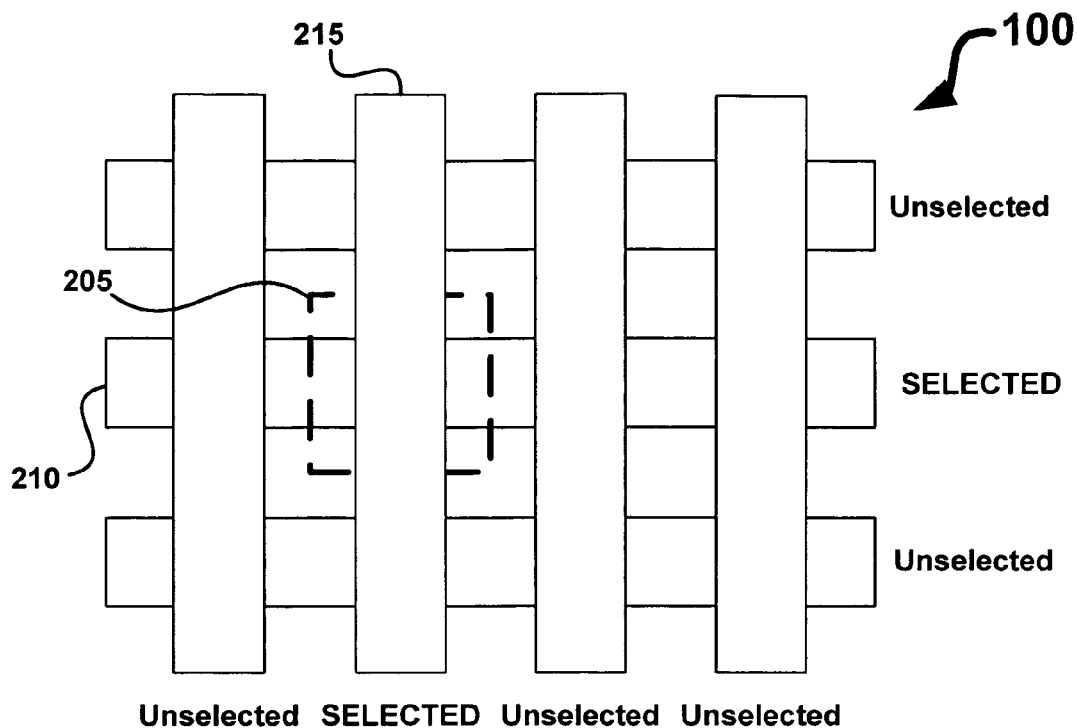
FIG. 2A depicts a plan view of selection of a memory cell in the cross point array depicted in FIG. 1A.
Figure 2B:
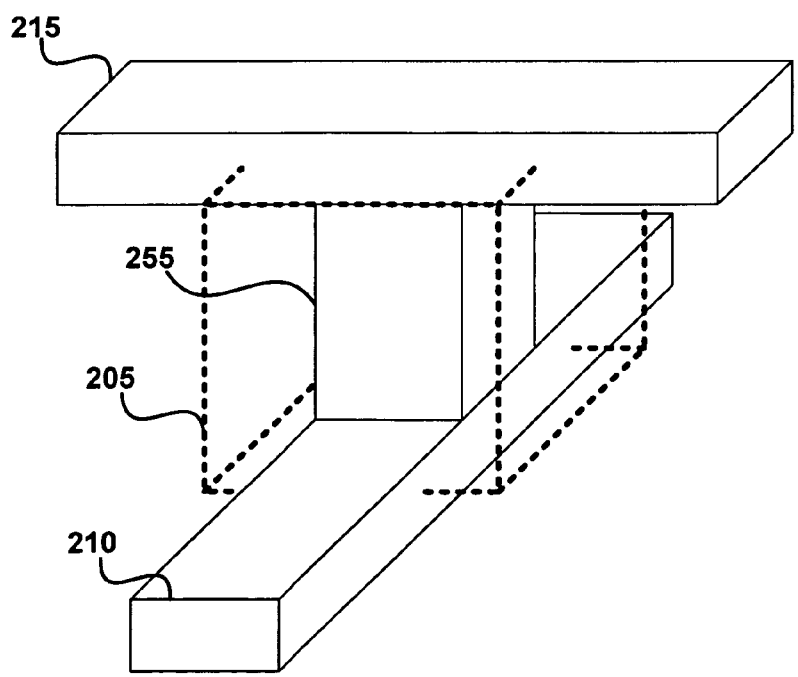
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110, creating a stacked cross point array.

Figure 1B:
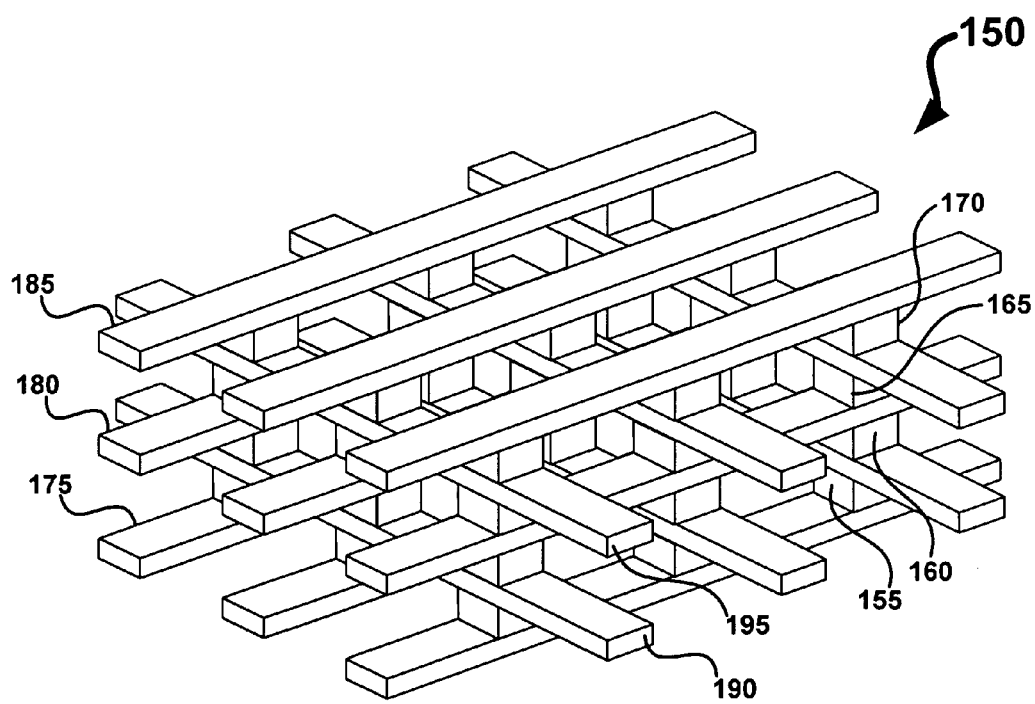
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

One benefit of the cross point array is that the active circuitry that drives the cross point array 100 or 150 can be placed beneath the cross point array, therefore reducing the footprint required on a semiconductor substrate. However, the cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
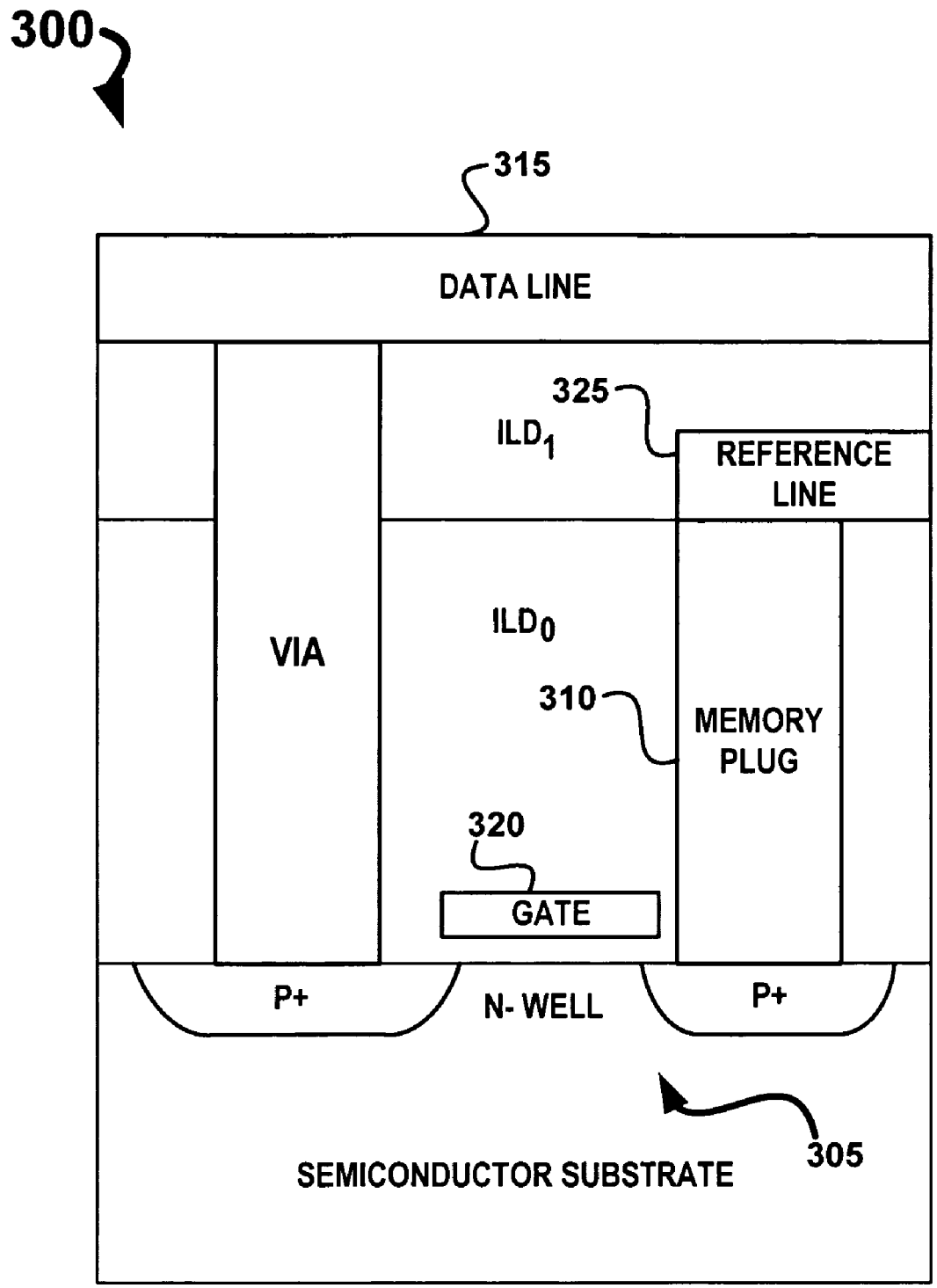
FIG. 3 depicts a generalized cross-sectional representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other.

Memory Chip Configuration

Figure 4A:
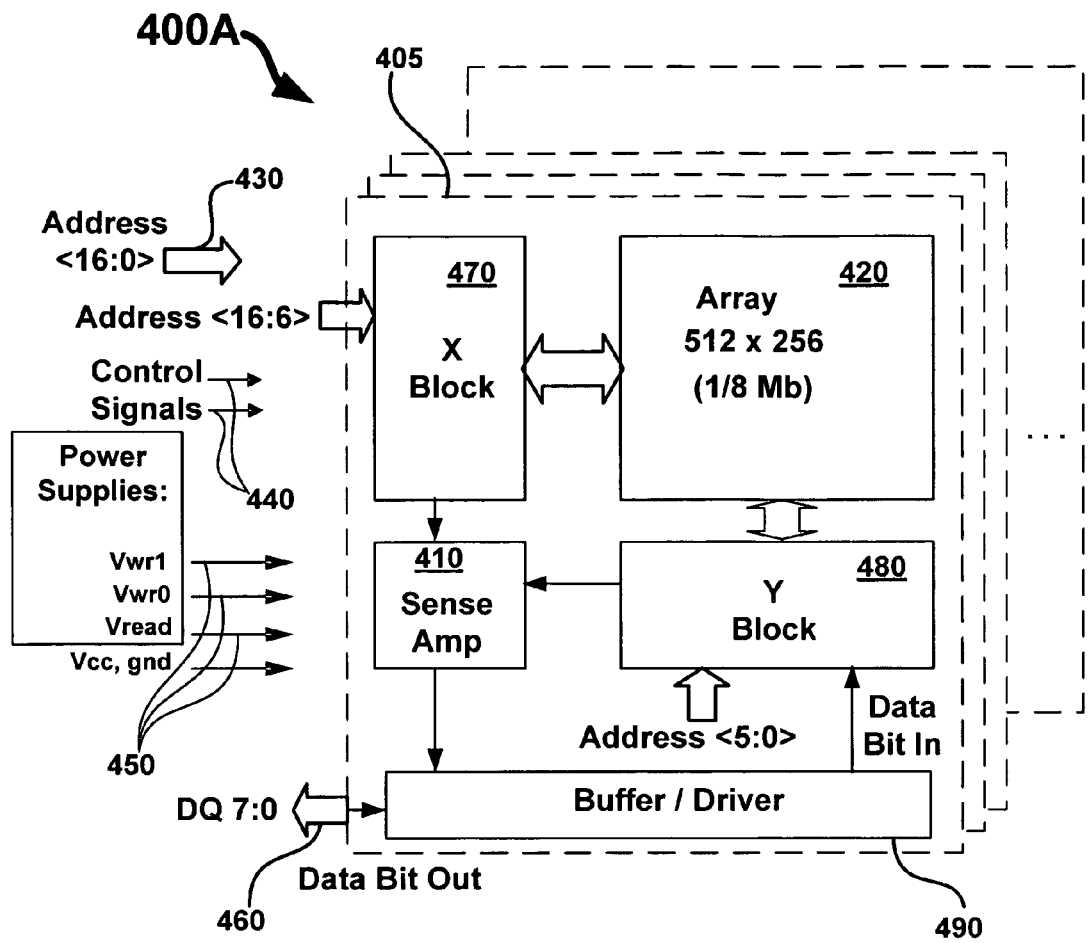
FIG. 4A depicts a block diagram of a representative implementation of an exemplary 1 MB memory.

FIG. 4A is a block diagram of a representative implementation of an exemplary 1 MB memory 400A. Physical layouts might differ, but each memory bit block 405 can be formed on a separate portion of a semiconductor substrate. Input signals into the memory 400A can include an address bus 430, a control bus 440, some power supplies 450 (typically Vcc and ground—the other signals of bus 450 can be internally generated by the 1 MB memory 400A), and a data bus 460. The control bus 440 typically includes signals to select the chip, to signal whether a read or write operation should be performed, and to enable the output buffers when the chip is in read mode. The address bus 430 specifies which location in the memory array is accessed—some addresses going to the X block 470 (typically including a predecoder and an X-decoder) to select one line out of the horizontal array lines. The other addresses go to a Y block 480 (typically including a predecoder and a Y-decoder) to apply the appropriate voltage on specific vertical lines. Each memory bit block 405 operates on one line of the memory chip data bus 460.

Figure 4B:
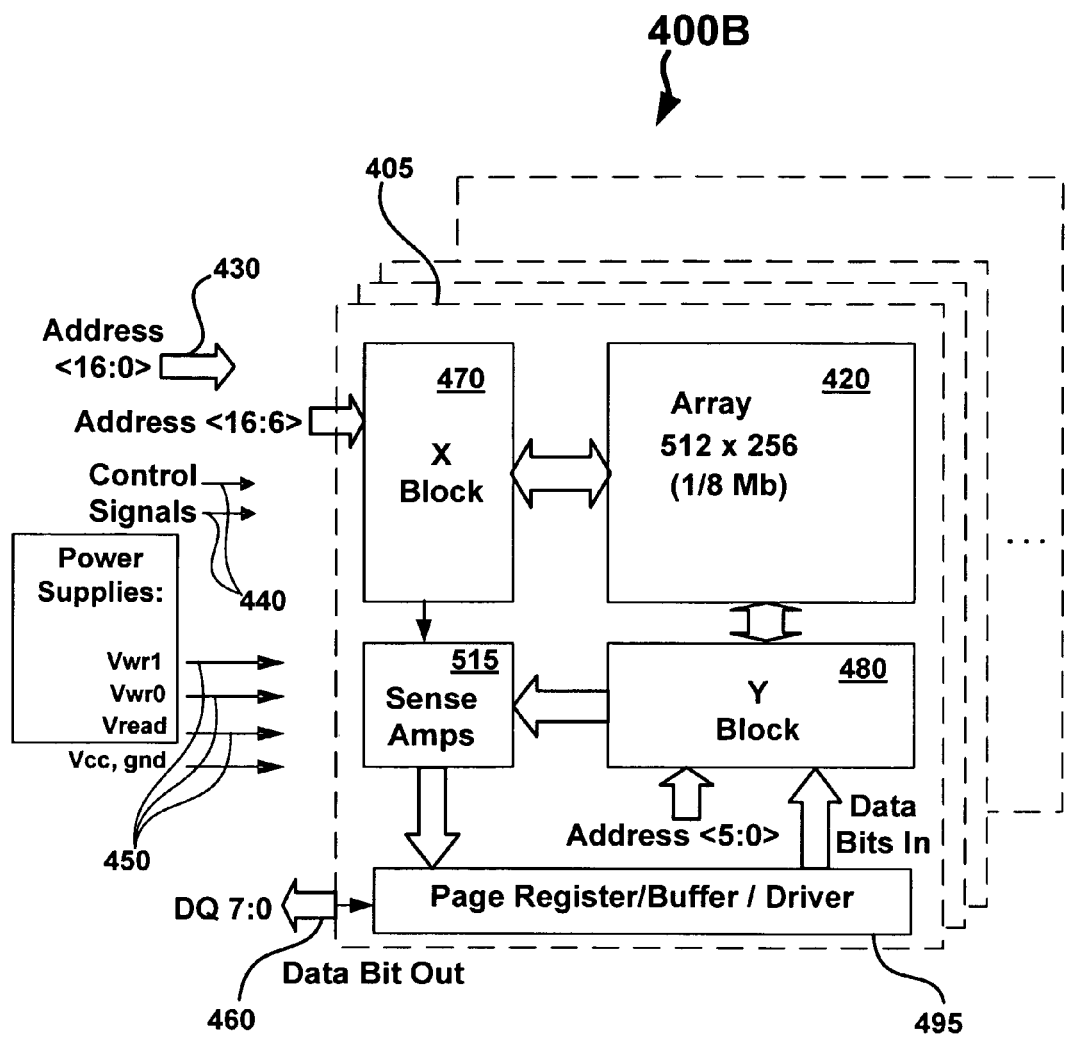
FIG. 4B depicts a block diagram of an exemplary memory that includes sensing circuits that are capable of reading multiple bits.

The reading of data from a memory array 420 is relatively straightforward: an x-line is energized, and current is sensed by the sensing circuits 410 on the energized y-lines and converted to bits of information. FIG. 4B is a block diagram of an exemplary memory 400B that includes sensing circuits 415 that are capable of reading multiple bits. The simultaneous reading of multiple bits involves sensing current from multiple y-lines simultaneously.

During a write operation, the data is applied from the data bus 460 to the input buffers and data drivers 490 to the selected vertical lines, or bit lines. Specifically, when binary information is sent to the memory chip 400B, it is stored in latch circuits within the circuits 495. Within the circuits 495, each y-line can either have an associated driver circuit or a group of y-lines can share a single driver circuit if the non-selected lines in the group are held to a constant voltage that would not cause the unselected memory plugs to experience any change in resistance. As an example, there may be 1024 y-lines in a cross point array, and the page register may include 8 latches, in which case the y-block would decode 1 out of 128 y-lines and connect the selected lines to block 495. The driver circuit then writes the 1 or 0 to the appropriate memory plug. The writing can be performed in multiple cycles. In a scheme described in PCT International Application No. PCT/US2004/013836, filed May 3, 2004, incorporated herein by reference, all the 1s can be written during a first cycle and all the 0s can be written during a second cycle. As described below, certain memory plugs can have multiple stable distinct resistive states. With such multi-level resistance memory plugs, driver circuits could program, for example, states of 00, 01, 10 or 11 by varying write voltage magnitude or pulse length. Regardless of how the write operations and the read operations are implemented, they can collectively be described as the normal operations of the memory array 420 and are, of course, dictated by the specific chip architecture that is used.

It is to be noted that such an architecture can be expanded to create a memory where one array handles all the bits of the data bus, as opposed to having multiple arrays, or memory bit blocks as described above. For example, if the data bus, or memory data organization, also called data width, is 16-bit wide, the y-block of one cross point array can be made to decode 16 lines simultaneously. By applying the techniques of simultaneous reads and 2-cycle writes, such a memory chip with only one array can read and program 16-bit words.

Memory Plug

Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If each conductive array line carried ½ $V_W$, the current path would be the memory plug at the intersection of the two conductive array lines that each carried ½ $V_W$. The other memory plugs would exhibit such high resistances from the non-ohmic characteristic that current would not flow through the half-selected plugs.

A non-ohmic device might be used to cause the memory plug to exhibit a non-linear resistive characteristic. Exemplary non-ohmic devices include three-film metal-insulator-metal (MIM) structures and back-to-back diodes in series. Separate non-ohmic devices, however, may not be necessary. Certain fabrications of the memory plug can cause a non-ohmic characteristic to be imparted to the memory cell. While a non-ohmic characteristic might be desirable in certain arrays, it may not be required in other arrays.

Electrodes will typically be desirable components of the memory plugs, a pair of electrodes sandwiching the memory element. If the only purpose of the electrodes is as a barrier to prevent metal inter-diffusion, then a thin layer of non-reactive metal, e.g. TiN, TaN, Pt, Au, and certain metal oxides could be used. However, electrodes may provide advantages beyond simply acting as a metal inter-diffusion barrier. Electrodes (formed either with a single layer or multiple layers) can perform various functions, including: prevent the diffusion of metals, oxygen, hydrogen and water; act as a seed layer in order to form a good lattice match with other layers; act as adhesion layers; reduce stress caused by uneven coefficients of thermal expansion; and provide other benefits. Additionally, the choice of electrode layers can affect the memory effect properties of the memory plug and become part of the memory element.

The "memory element electrodes" are the electrodes (or, in certain circumstances, the portion of the conductive array lines) that the memory elements are sandwiched in-between. As used herein, memory element electrodes are what allow other components to be electrically connected to the memory element. It should be noted that in both cross point arrays and transistor memory arrays have exactly two memory element electrodes since the memory plug has exactly two terminals, regardless of how many terminals the memory cell has. Those skilled in the art will appreciate that a floating gate transistor, if used as a memory element, would have exactly three memory element electrodes (source, drain and gate).

Memory Effect

The memory effect is a hysteresis that exhibits a resistive state change upon application of a voltage while allowing non-destructive reads. A non-destructive read means that the read operation has no effect on the resistive state of the memory element. Measuring the resistance of a memory cell is generally accomplished by detecting either current after the memory cell is held to a known voltage, or voltage after a known current flows through the memory cell. Therefore, a memory cell that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. It should be appreciated that the magnitude of $|-V_R|$ does not necessarily equal the magnitude of $|+V_R|$.

Furthermore, it is possible to have a memory cell that can be switched between resistive states with voltages of the same polarity. For example, in the paper "The Electroformed metal-insulator-metal structure: a comprehensive model," already incorporated by reference, Thurstans and Oxley describe a memory that maintains a low resistive state until a certain $V_P$ is reached. After $V_P$ is reached the resistive state can be increased with voltages. After programming, the high resistive state is then maintained until a $V_T$ is reached. The $V_T$ is sensitive to speed at which the program voltage is removed from the memory cell. In such a system, programming $R_1$ would be accomplished with a voltage pulse of $V_P$, programming $R_0$ would be accomplished with a voltage pulse greater than $V_P$, and reads would occur with a voltages below $V_T$. Intermediate resistive states (for multi-level memory cells) are also possible.

The $R_1$ state of the memory plug may have a best value of 10 kΩ to 100 kΩ. If the $R_1$ state resistance is much less than 10 kΩ, the current consumption will be increased because the cell current is high, and the parasitic resistances will have a larger effect. If the $R_1$ state value is much above 100 kΩ, the RC delays will increase access time. However, workable single state resistive values may also be achieved with resistances as low as 5 kΩ and as high as 1 MΩ. Typically, a single state memory would have the operational resistances of $R_0$ and $R_1$ separated by a factor of 10.

Since memory plugs can be placed into several different resistive states, multi-bit resistive memory cells are possible. Changes in the resistive property of the memory plugs that are greater than a factor of 10 might be desirable in multi-bit resistive memory cells. For example, the memory plug might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000.

Creating the Memory Effect

Tunneling is the process whereby electrons pass through a barrier in the presence of a high electric field. Tunneling is exponentially dependant on both a barrier's height and its width. Barrier height is typically defined as the potential difference between the Fermi energy of a first conducting material and the band edge of a second insulating material. The Fermi energy is that energy at which the probability of occupation of an electron state is 50%. Barrier width is the physical thickness of the insulating material.

The barrier height might be modified if carriers or ions are introduced into the second insulating material, creating an additional electric field. A barrier's width can be changed if the barrier physically changes shape, either growing or shrinking. In the presence of a high electric field, both mechanisms could result in a change in conductivity.

Although the following discussion focuses mainly on purposefully modifying the barrier width, those skilled in the art will appreciate that other mechanisms can be present (but not controlling), including (but not limited to) barrier height modification, carrier charge trapping space-charge limited currents, thermionic emission limited conduction, and/or electrothermal Poole-Frenkel emission.

Figure 5C:
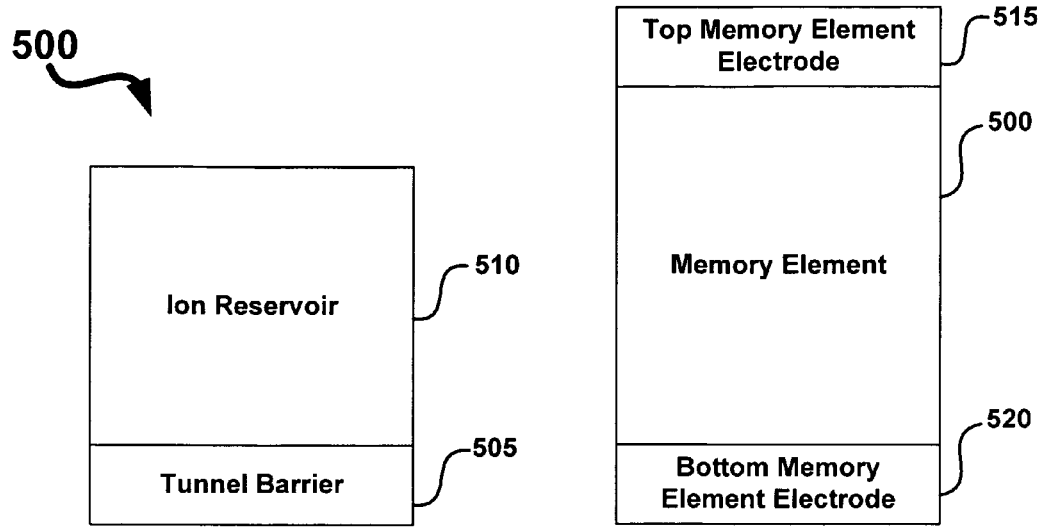
FIG. 5C depicts a block diagram of the memory element in a three-terminal memory cell.
Figure 5C:
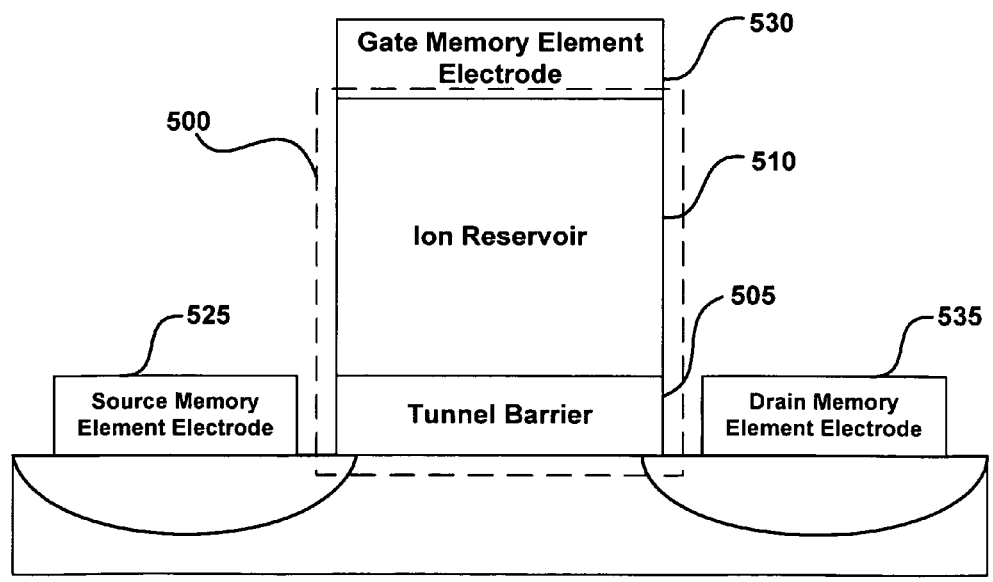

FIG. 5A is a block diagram representing the basic components of a memory element 500, FIG. 5B is a block diagram of the memory element 500 in a two-terminal memory cell, and FIG. 5C is a block diagram of the memory element in a three-terminal memory cell.

FIG. 5A shows a tunnel barrier 505 and an ion reservoir 510, two basic components of the memory element 500. FIG. 5B shows the memory element 500 between a top memory electrode 515 and a bottom memory electrode 520. The orientation of the memory element (i.e., whether the tunnel barrier 505 is near the top memory electrode 515 or the bottom memory electrode 520) may be important for processing considerations, including the necessity of seed layers and how the tunnel barrier reacts with the ion reservoir 510 during deposition. FIG. 5C shows the memory element 500 oriented with the tunnel barrier 505 on the bottom in a three-terminal transistor device, having a source memory element electrode 525, a gate memory element electrode 530 and a drain memory element electrode 535. In such an orientation, the tunnel barrier 505 could also function as a gate oxide.

Referring back to FIG. 5A, the tunnel barrier 505 will typically be less than 50 angstroms. If the tunnel barrier 505 is much greater than 50 angstroms, then the electric field that is required to move electrons through the memory element 500 via tunneling becomes too high for most electronic devices. Depending on the tunnel barrier 505 material, a preferred tunnel barrier 505 width might be between 15 and 20 angstroms for circuits where rapid access times (on the order of tens of nanoseconds, typically below 100 ns) in small dimension devices (on the order of hundreds of nanometers) are desired.

Fundamentally, the tunnel barrier 505 is an insulator. While some embodiments have other requirements of the tunnel barrier 505 (e.g., being permeable to positive or negative ions, as described in connection with FIG. 6C), the main conduction mechanism through the tunnel barrier 505 should be tunneling. Insulators suitable for some embodiments include various metal oxides such as $Al_2O_3$, $Ta_2O_5$ and $HfO_2$. The tunnel barrier 505 will typically be of very high quality, being as uniform as possible to allow for predictability in the voltage required to obtain a current through the memory element 500. Atomic layer deposition and plasma oxidation are examples of methods that can be used to create very high quality tunnel barriers. Although tunnel barriers can be obtained by allowing a reactive metal to simply come in contact with an ion reservoir 510, as described in PCT International Application No. PCT/US2004/013836, filed May 3, 2004, already incorporated herein by reference, such barriers may be of low quality and lacking uniformity. The electric field at the tunnel barrier 505 is typically high enough to promote tunneling at thicknesses less than 50 angstroms. The electric field is typically higher than the electric field at other points in the circuit due to factors such as the relatively high serial resistance of the tunnel barrier 505 compared to the rest of the circuit and the accumulation of charge at the interface. The electric field not only enables tunneling, but, with the appropriate ion reservoir 510, also allows the effective width of the tunnel barrier 505 to change.

The ion reservoir 510 is a material that is conductive enough to allow current to flow and has mobile ions. The ion reservoir 510 can be, for example, an oxygen reservoir with mobile oxygen ions. Oxygen ions are negative in charge, and will flow in the direction opposite of current. As will be described in FIG. 6A, FIG. 6B, FIG. 6C, and FIG. 6D the movement of oxygen ions can potentially modify the effective barrier width in various ways.

FIG. 6A is a block diagram where oxygen accumulation near the tunnel barrier 505—oxygen reservoir 625 interface results in a low conductivity region 605. This low conductivity region 605 is cumulative with the tunnel barrier 505, forcing electrons to tunnel a greater distance to reach the second memory element electrode 520. Because of the exponential effect of barrier width on tunneling, the low conductivity region 605 can be just a few angstroms wide and still have a very noticeable effect on the memory element's effective resistance.

For a low conductivity region 605 to be created in the oxygen reservoir 625 it must have the physical property of being less conductive in an oxygen-rich state. An example of a conductive material that has mobile oxygen ions and is less conductive in an oxygen-rich state is reduced strontium titanate (STO) and similar perovskites (a perovskite generally being in the form of an $ABX_3$ structure, where A has an atomic size of 1.0-1.4 Å and B has an atomic size of 0.45-0.75 Å for the case where X is either oxygen or fluorine). If data retention is important, the oxygen-rich state should be stable enough to resist the migratory force that results from a concentration gradient.

Furthermore, it may be important to either avoid or maintain an oxygen-deficient state in the bulk of the oxygen reservoir 625 to maintain conductivity. In such a circumstance, a larger oxygen reservoir 625 will allow for the oxygen-deficient effects to be distributed throughout the material. For example, if the oxygen reservoir 625 is a perovskite it might be important that the $ABO_3$ structure have a slight oxygen deficiency in order to maintain conductivity. If two atomic layers of stoichiometric $ABO_3$ were sufficient to produce an appropriate low conductivity region 605, then 400 atomic layers of $ABO_{3-x}$ would (assuming a constant deficiency gradient) vary the oxygen deficiency of the $ABO_{3-x}$ oxygen reservoir 625 by 0.5%. Accordingly, both states of the oxygen reservoir 625 (i.e., with and without the excess oxygen from the low conductivity region 605) should be conductive. Of course, if oxygen were available from other sources (e.g., if the first memory element electrode 515 were exposed to the atmosphere and permeable to oxygen) the height of the oxygen reservoir 625 may not be as critical.

If the memory element 500 is to be reprogrammable, then a voltage of opposite polarity should be sufficient to push the excess oxygen out of the low conductivity region 605 and back into the oxygen deficient regions of the oxygen reservoir 625. Depending upon whether the activation energy of reducing the low conductivity region 605 in a redox reaction is greater than or less than the energy required to create the low conductivity region can inform the read polarity choice. If reducing the low conductivity region 605 with a positive voltage takes more energy than creating an oxygen-rich conductivity region 605 with a negative voltage, then positive reads have a lesser chance of disturbing the resistive state of the memory element.

FIG. 6B is a block diagram where oxygen depletion near the tunnel barrier 505—oxygen reservoir 630 interface results in a low conductivity region 610. For a low conductivity region 610 to be created in the oxygen reservoir 630 it must have the physical property of being less conductive in an oxygen-deficient state. Some examples of materials that have mobile oxygen ions and are less conductive in an oxygen-deficient state are $Pr_{0.7}Ca_{0.3}MnO_3$, $Pr_{0.5}Ca_{0.5}MnO_3$ and other PCMO perovskites.

Similar to the embodiment of FIG. 6A, data retention would be improved if the oxygen-deficient state were stable enough to resist the migratory force that results from a concentration gradient. Additionally, reprogramability would require an opposite polarity voltage that is capable of replacing the oxygen deficiencies of the low conductivity region 610.

Figure 6C:
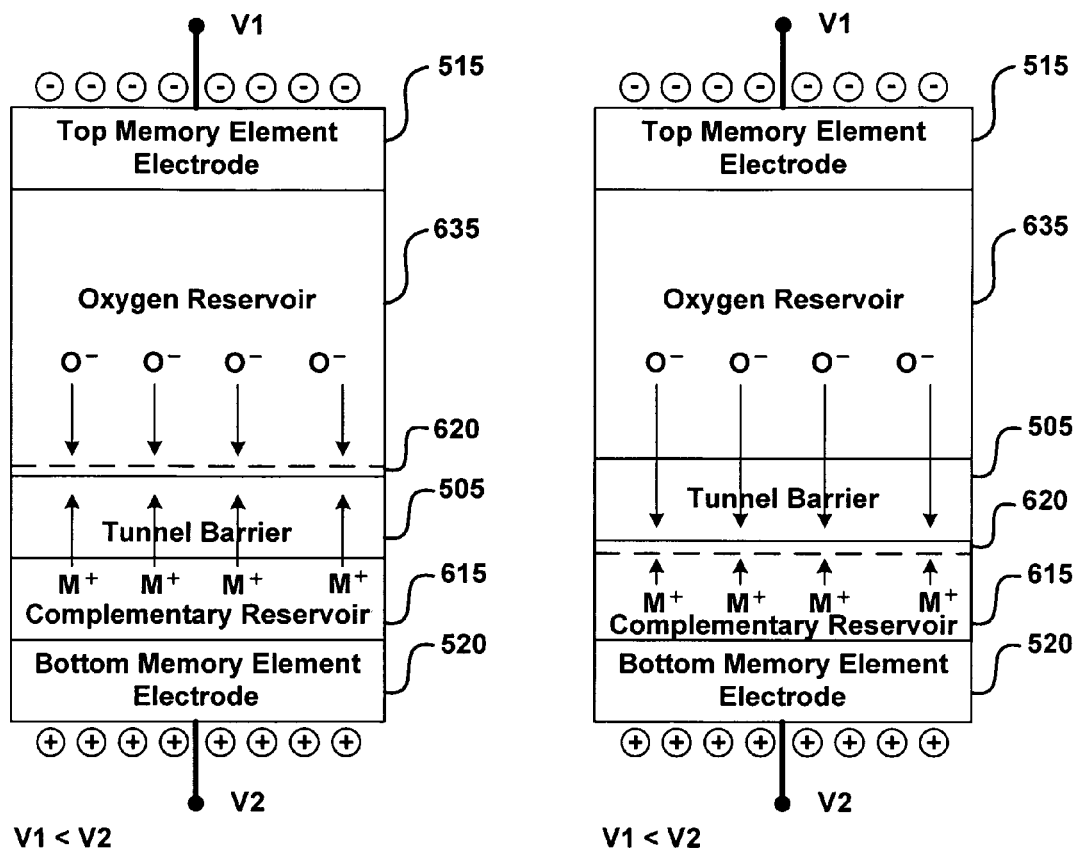
FIG. 6C depicts two block diagrams where a redox reaction between the oxygen reservoir and a complementary reservoir results in a low conductivity region.

FIG. 6C shows two block diagrams where a redox reaction between the oxygen reservoir 635 and a complementary reservoir 615 results in a low conductivity region 620. In the case where the ion reservoir 510 (see FIG. 5A) is made up of negative oxygen ions, an appropriate complementary reservoir 615 would include mobile positively charged metal ions (designated as $M^+$ in FIG. 6C). The mechanism is similar to the embodiment of FIG. 6A, except positively charged metal ions $M^+$ migrate through the tunnel barrier 505 to combine with oxygen ions $O^-$ in the oxygen reservoir 635, creating the low conductivity region 620. Those skilled in the art will appreciate that redox reaction can occur at either the top or bottom surface of the tunnel barrier 505. As shown in the first diagram on the left side of the drawing sheet of FIG. 6C, the low conductivity region 620 will form at the top of the tunnel barrier 505 if the mobility of the complementary ions $M^+$ is greater than the mobility of the oxygen ions through the tunnel barrier 505. Conversely, if the mobility of oxygen ions $O^-$ is greater than the mobility of the complementary ions $M^+$ through the tunnel barrier 505, then the low conductivity region 620 will form at the bottom of the tunnel barrier 505 as shown in the second diagram on the right side of the drawing sheet of FIG. 6C. In the first diagram the free oxygen ions (designated as $O^-$ in FIG. 6C) in the oxygen reservoir 635 do not move into the tunnel barrier 505. In the second diagram the free metal ions $M^+$ in the metal reservoir 615 do not move into the tunnel barrier 505. In either case the metal reservoir 615 is any material that is conductive enough to allow current to flow and has free metal ions $M^+$. For ease of fabrication, the complementary reservoir 615 may be the non-oxidized form (either the bare metal(s) or the reduced non-stoichiometric oxide) of the same material that is used for the tunnel barrier 505.

Data retention will typically be very good in a metal reservoir embodiment because metal oxides are usually very stable. In fact, reversing the redox reaction requires a great amount of energy for many oxides, making the cells most useful for one-time programmable memories. Oxides with a low activation energy are required if a reprogrammable memory is desired.

For one-time programmable memories where a complementary voltage pulse has very little effect on the effective tunnel barrier width, it would typically be most beneficial to use the complementary polarity during reads to prevent disturb. The polarity of the voltage that creates the low conductivity region 620 would only be used during writes.

Furthermore, since the effective width of the barrier is limited only by the effect of ion deficiency in the ion reservoir and the availability of ions in the complimentary reservoir, many different barrier widths can be formed if large enough reservoirs are used. Accordingly, multiple bits per cell can be easily implemented with different resistive states.

It should be appreciated that the term "memory element" includes all the layers that contribute to the memory effect. Accordingly, in the embodiment of FIG. 6C, the memory element includes the oxygen reservoir 635, the low conductivity region 620 (when the memory cell is in the high resistive state), the tunnel barrier 505, and the complementary reservoir 615. When the memory element is in the low resistive state, the tunnel barrier 505 has the lowest conductivity (i.e., the highest series resistance) relative to all the other layers of the memory element, including the entire oxygen reservoir 635 and the entire metal reservoir 615 as neither of these would have a low conductivity region 620 in the low resistive state.

Figure 6D:
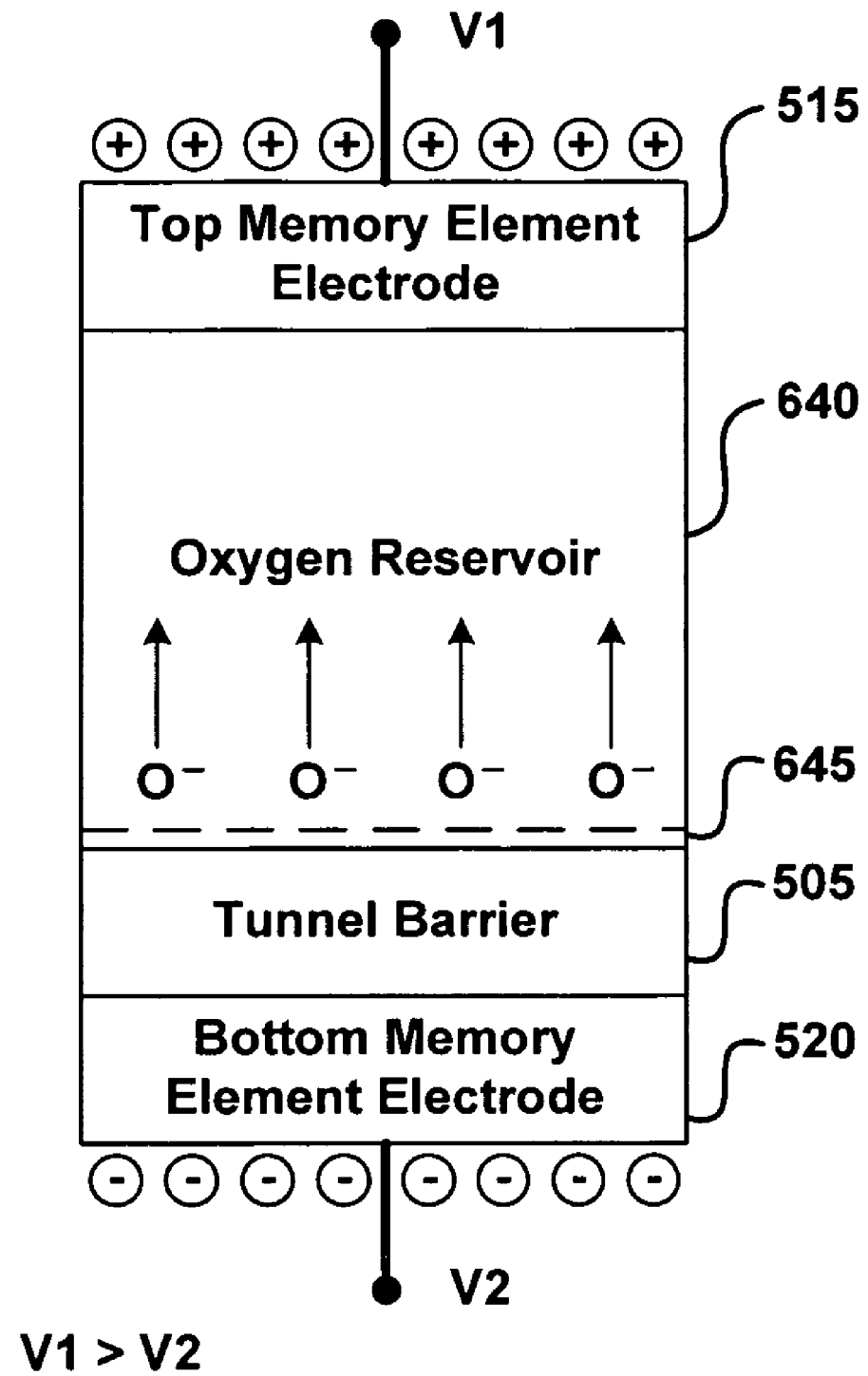
FIG. 6D depicts a block diagram where a low conductivity region is initially fabricated, and then reduced to shrink the effective tunnel barrier width It is to be understood that, in the drawings, like reference numerals designate like structural elements. Also, it is understood that the depictions in the FIGs. are not necessarily to scale.

FIG. 6D is a block diagram where a low conductivity region 645 is initially fabricated, and then reduced to shrink the effective tunnel barrier width. Since the memory element is initially fabricated with the low conductivity region 645, an appropriate voltage would reduce the material into more conductive components. This embodiment will typically be used only in reprogrammable memory cells because the activation energy to re-oxide the material is typically not very high.

It should be appreciated that the problem of an oxygen-deficient oxygen reservoir 640 is then diminished since the oxygen reservoir 640 does not need to supply any oxygen ions to the low conductivity region 645. However, the oxygen reservoir 640 will need to be able to maintain its conductivity once the excess oxygen ions are removed from the low conductivity region 645 and dispersed into the oxygen reservoir 640. In such an embodiment, the tunnel barrier 505 and the low conductivity region 645 could be a single material for ease of fabrication.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. For example, although the ion reservoir was described as being negative in connection with the oxygen reservoir, a positively charged ion reservoir may have the same functionality, as long as the other physical requirements of the specific embodiments are met. Furthermore, while redox reactions is one possible explanation of how the various materials interact, the inventors do not wish to be bound by any explanation of how the low conductivity region is created, as other mechanisms, such as phase change, may be involved. Accordingly, that which is intended to be protected by Letters Patent is set forth in the claims and includes all variations and modifications that fall within the spirit and scope of the claim.

What is claimed is:

1. A programmed two-terminal memory cell, comprising:
    a two-terminal memory element configured to store non-volatile data as a programmed conductivity and including electrically in series with one another
        an ion reservoir including a plurality of first mobile ions having a first electric charge and a first ion mobility,
        a complementary ion reservoir including a plurality of second mobile ions having a second electric charge and a second ion mobility, the second electric charge is opposite in polarity to the first electric charge and the plurality of second mobile ions are a different ion type than the plurality of first mobile ions,
        a tunnel barrier layer in contact with the ion reservoir and the complementary ion reservoir and having a first thickness, and
        a low conductivity region comprised of accumulated mobile ions and having a second thickness that is substantially less than the first thickness, the first thickness and second thickness cumulatively form a variable tunnel barrier thickness that is approximately 50 Å or less, the low conductivity region is positioned either in the ion reservoir adjacent to an interface between the ion reservoir and the tunnel barrier layer or in the complementary ion reservoir adjacent to an interface between the complementary ion reservoir and the tunnel barrier layer, and
    wherein the memory element stores the non-volatile data as the programmed conductivity when the variable tunnel barrier thickness comprises the first thickness and second thickness.

2. The programmed two-terminal memory cell of claim 1, wherein the accumulated mobile ions comprise a portion of the plurality of second mobile ions and the low conductivity region is positioned in the ion reservoir.

3. The programmed two-terminal memory cell of claim 2, wherein the second ion mobility is greater than the first ion mobility.

4. The programmed two-terminal memory cell of claim 1, wherein the accumulated mobile ions comprise a portion of the plurality of first mobile ions and the low conductivity region is positioned in the complementary ion reservoir.

5. The programmed two-terminal memory cell of claim 4, wherein the first ion mobility is greater than the second ion mobility.

6. The programmed two-terminal memory cell of claim 1, wherein the plurality of first mobile ions comprise oxygen ions and the plurality of second mobile ions comprise metal ions.

7. The programmed two-terminal memory cell of claim 6, wherein the first electric charge is negative and the second electric charge is positive.

8. The programmed two-terminal memory cell of claim 1, wherein the tunnel barrier layer is made from a material that is permeable to mobile ions.

9. The programmed two-terminal memory cell of claim 1, wherein the first thickness of the tunnel barrier layer is approximately 30 Å or less.

10. The programmed two-terminal memory cell of claim 1, wherein the ion reservoir and the complementary ion reservoir are made from different conductive metal oxide materials.

11. The programmed two-terminal memory cell of claim 10, wherein the different conductive metal oxide materials comprise different perovskite materials.

12. The programmed two-terminal memory cell of claim 1, wherein the tunnel barrier layer comprises an insulating oxide material.

13. The programmed two-terminal memory cell of claim 12, wherein the insulating oxide material comprises a metal oxide.

14. The programmed two-terminal memory cell of claim 13, wherein the complementary ion reservoir comprises a non-oxidized form of the metal oxide.

15. The programmed two-terminal memory cell of claim 1, wherein the two-terminal memory element is further configured to reversibly switch between the programmed conductivity and an erased conductivity by the application of a write voltage across the memory element, the erased conductivity is higher than the programmed conductivity, and
    a first polarity and a first magnitude of the write voltage is operative to drive the accumulated ions out of the low conductivity region thereby substantially or completely eliminating the second thickness such that the variable tunnel barrier thickness comprises approximately the first thickness and the memory element stores the non-volatile data as the erased conductivity, and
    a second polarity and a second magnitude of the write voltage is operative to reestablish the low conductivity region such that the variable tunnel barrier thickness comprises the first thickness and the second thickness and the memory element stores the non-volatile data as the programmed conductivity.

16. The programmed two-terminal memory cell of claim 15, wherein the first polarity and the second polarity are opposite polarities.

17. The programmed two-terminal memory cell of claim 15, wherein the first magnitude and second magnitude of the write voltage are not equal to each other.

18. The programmed two-terminal memory cell of claim 1 and further comprising:
    a non-ohmic device electrically in series with the two-terminal memory element.

19. An erased two-terminal memory cell, comprising:
    a two-terminal memory element configured to store non-volatile data as an erased conductivity and including electrically in series with one another
        an ion reservoir including a plurality of first mobile ions having a first electric charge and a first ion mobility,
        a complementary ion reservoir including a plurality of second mobile ions having a second electric charge and a second ion mobility, the second electric charge is opposite in polarity to the first electric charge and the plurality of second mobile ions are a different ion type than the plurality of first mobile ions, a tunnel barrier layer in contact with the ion reservoir and the complementary ion reservoir and having a first thickness that is approximately 50 Å or less and operative to define a variable tunnel barrier thickness, and wherein the memory element stores the non-volatile data as the erased conductivity when the variable tunnel barrier thickness comprises the first thickness.

20. The erased two-terminal memory cell of claim 19, wherein the plurality of first mobile ions comprise oxygen ions and the plurality of second mobile ions comprise metal ions.

21. The erased two-terminal memory cell of claim 20, wherein the first electric charge is negative and the second electric charge is positive.

22. The erased two-terminal memory cell of claim 19, wherein the tunnel barrier layer is made from a material that is permeable to mobile ions.

23. The erased two-terminal memory cell of claim 19, wherein the first thickness of the tunnel barrier layer is approximately 30 Å or less.

24. The erased two-terminal memory cell of claim 19, wherein the ion reservoir and the complementary ion reservoir are made from different conductive metal oxide materials.

25. The erased two-terminal memory cell of claim 24, wherein the different conductive metal oxide materials comprise different perovskite materials.

26. The erased two-terminal memory cell of claim 19, wherein the tunnel barrier layer comprises an insulating oxide material.

27. The erased two-terminal memory cell of claim 26, wherein the insulating oxide material comprises a metal oxide.

28. The erased two-terminal memory cell of claim 27, wherein the complementary ion reservoir comprises a non-oxidized form of the metal oxide.

29. The erased two-terminal memory cell of claim 19 and further comprising:
a low conductivity region comprised of accumulated mobile ions and having a second thickness that is substantially less than the first thickness, the first thickness and second thickness cumulatively form the variable tunnel barrier thickness, the low conductivity region is positioned either in the ion reservoir adjacent to an interface between the ion reservoir and the tunnel barrier layer or in the complementary ion reservoir adjacent to an interface between the complementary ion reservoir and the tunnel barrier layer, and
wherein the memory element stores the non-volatile data as a programmed conductivity when the variable tunnel barrier thickness comprises the first thickness and second thickness and the programmed conductivity is lower than the erased conductivity.

30. The erased two-terminal memory cell of claim 29, wherein the two-terminal memory element is further configured to reversibly switch between the erased conductivity and the programmed conductivity by the application of a write voltage across the memory element, and
a first polarity and a first magnitude of the write voltage is operative to drive the accumulated ions out of the low conductivity region thereby substantially or completely eliminating the second thickness such that the variable tunnel barrier thickness comprises approximately the first thickness and the memory element stores the non-volatile data as the erased conductivity, and a second polarity and a second magnitude of the write voltage is operative to reestablish the low conductivity region such that the variable tunnel barrier thickness comprises the first thickness and the second thickness and the memory element stores the non-volatile data as the programmed conductivity.

31. The erased two-terminal memory cell of claim 19 and further comprising:
a non-ohmic device electrically in series with the two-terminal memory element.

32. A re-writeable non-volatile memory device, comprising:
a plurality of two-terminal memory cells arranged in a two-terminal cross-point array configuration with a first terminal of each memory cell electrically coupled with only one of a plurality of first conductive array lines and a second terminal of each memory cell electrically coupled with only one of a plurality of second conductive array lines, each memory cell configured to store non-volatile data as a programmed conductivity or an erased conductivity, and each memory cell including electrically in series with one another
an ion reservoir including a plurality of first mobile ions having a first electric charge and a first ion mobility,
a complementary ion reservoir including a plurality of second mobile ions having a second electric charge and a second ion mobility, the second electric charge is opposite in polarity to the first electric charge and the plurality of second mobile ions are a different ion type than the plurality of first mobile ions,
a tunnel barrier layer in contact with the ion reservoir and the complementary ion reservoir and having a first thickness when the memory cell stores data as the programmed conductivity or the erased conductivity, and
a low conductivity region present in the memory cell only when the memory cell stores data as the programmed conductivity, the low conductivity region comprised of accumulated mobile ions and having a second thickness that is substantially less than the first thickness, the first thickness and second thickness cumulatively form a variable tunnel barrier thickness that is approximately 50 Å or less, the low conductivity region is positioned either in the ion reservoir adjacent to an interface between the ion reservoir and the tunnel barrier layer or in the complementary ion reservoir adjacent to an interface between the complementary ion reservoir and the tunnel barrier layer,
wherein each memory cell stores the non-volatile data as the programmed conductivity when the variable tunnel barrier thickness comprises the first thickness and second thickness,
wherein each memory cell stores the non-volatile data as the erased conductivity when the variable tunnel barrier thickness comprises only the first thickness; and
a substrate including active circuitry fabricated on the substrate, at least a portion of the active circuitry is electrically coupled with the plurality of first and second conductive array lines and operative to apply voltages across selected conductive array lines during read and write operations, the two-terminal cross-point array is in contact with the substrate and is fabricated directly over the substrate.

33. The re-writeable non-volatile memory device of claim 32 and further comprising:
a non-ohmic device electrically in series with the first and second terminals of each memory cell.

* * * * *